United States Patent
Kim et al.

(10) Patent No.: US 9,587,880 B2
(45) Date of Patent: Mar. 7, 2017

(54) APPARATUS AND METHOD FOR DRYING SUBSTRATE

(71) Applicant: SEMES CO., LTD., Chungcheongnam-do (KR)

(72) Inventors: Boong Kim, Chungcheongnam-do (KR); Ki Bong Kim, Chungcheongnam-do (KR); Gil Hun Song, Chungcheongnam-do (KR); Oh Jin Kwon, Chungcheongnam-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 639 days.

(21) Appl. No.: 13/905,676

(22) Filed: May 30, 2013

(65) Prior Publication Data

US 2013/0318812 A1    Dec. 5, 2013

(30) Foreign Application Priority Data

May 31, 2012  (KR) .................. 10-2012-0058233
Aug. 21, 2012  (KR) .................. 10-2012-0091456

(51) Int. Cl.
*F26B 21/12* (2006.01)
*F26B 5/00* (2006.01)
*H01L 21/67* (2006.01)

(52) U.S. Cl.
CPC ........... *F26B 21/12* (2013.01); *F26B 5/005* (2013.01); *H01L 21/67017* (2013.01); *H01L 21/67034* (2013.01)

(58) Field of Classification Search
USPC .......................................... 34/340
See application file for complete search history.

(56) References Cited

U.S. PATENT DOCUMENTS

| | | | |
|---|---|---|---|
| 5,490,726 A * | 2/1996 | Davis | B01F 5/0656 137/100 |
| 7,219,677 B1 * | 5/2007 | Jackson | H01L 21/02101 134/100.1 |
| 2008/0029159 A1 * | 2/2008 | Lee | H01L 21/67028 137/154 |

(Continued)

FOREIGN PATENT DOCUMENTS

| | | |
|---|---|---|
| CN | 1371462 A | 9/2002 |
| CN | 1779920 A | 5/2006 |

(Continued)

*Primary Examiner* — David J Laux
(74) *Attorney, Agent, or Firm* — Carter, DeLuca, Farrell & Schmidt, LLP

(57) ABSTRACT

Provided is an apparatus and method for drying a substrate. The apparatus includes a housing, a substrate support member, a fluid supply member, and a discharge member. The housing provides a space in which a drying process is performed. The substrate support member is provided in the housing to support the substrate. The fluid supply member includes a supply line for supplying a process fluid of a supercritical state to the housing. The discharge member includes a discharge line for discharging the process fluid from the housing. Here, the supply line includes a first supply line provided to supply the process fluid to the housing at a first supply flow rate, and a second supply line provided to supply the process fluid to the housing at a second supply flow rate.

5 Claims, 14 Drawing Sheets

(56) References Cited

U.S. PATENT DOCUMENTS

2011/0000512 A1* 1/2011 Toshima .................. B08B 3/10
134/34
2012/0048304 A1* 3/2012 Kitajima ........... H01L 21/67034
134/30

FOREIGN PATENT DOCUMENTS

| CN | 101042540 A | 9/2007 |
|---|---|---|
| JP | 2003-510801 A | 3/2003 |
| JP | 2006130386 A | 5/2006 |
| JP | 2007175559 A | 7/2007 |
| JP | 2009-194092 A | 8/2009 |
| JP | 2012049446 A | 3/2012 |
| KR | 20090016974 A | 2/2009 |
| KR | 20100124584 A | 11/2010 |
| KR | 1020110012743 A | 2/2011 |
| KR | 20120008134 A | 1/2012 |
| KR | 20120041014 A | 4/2012 |

* cited by examiner

APPARATUS AND METHOD FOR DRYING SUBSTRATE

CROSS-REFERENCE TO RELATED APPLICATIONS

This U.S. non-provisional patent application claims priority under 35 U.S.C. §119 of Korean Patent Application Nos. 10-2012-0058233, filed on May 31, and 10-2012-0091456, filed on Aug. 21, 2012, the entire contents of which are hereby incorporated by reference.

BACKGROUND

The present disclosure herein relates to an apparatus and method for manufacturing a semiconductor substrate, and more particularly, to an apparatus and method for drying a substrate.

Generally, a semiconductor device is manufactured by performing various processes such as a photo process, an etching process, an ion implantation process, and a deposition process on a substrate such as a silicon wafer.

In this case, various kinds of foreign substances such as particles, organic contaminants, and metallic impurities occur during the processes. Since these foreign substances cause a defect of a substrate and act as a factor that has a direct effect on the performance and the yield of the semiconductor device, a cleaning process for removing the foreign substances is necessarily carried out during the manufacturing process of the semiconductor device.

The cleaning process includes a chemical treatment process that removes contaminants on a substrate with a chemical, a wet cleaning process that removes the chemical remaining on the substrate with pure water, and a drying process that removes the pure water remaining on the substrate by supplying a drying fluid.

In the past, the drying process was performed by supplying a heated nitrogen gas onto a substrate on which pure water remains. However, as the line width of a pattern formed on a substrate becomes narrow and the aspect ratio increases, it becomes difficult to remove pure water between patterns. For this, in recent years, pure water is substituted by a liquid organic solvent such as isopropyl alcohol having a higher volatility and a lower surface tension than pure water, and then a heated nitrogen gas is supplied to dry the substrate.

However, since the non-polar organic solvent and the polar pure water are not easily mixed, a large amount of liquid organic solvent needs to be supply for a long time to substitute pure water with the liquid organic solvent.

In a typical drying process, pure water has been substituted by organic solvent such as isopropyl alcohol having a relatively low surface tension, and then has been evaporated.

However, in this drying method, a pattern collapse is still caused regarding a semiconductor device including a fine circuit pattern in which the line width is equal to or less than about 30 nm even though the organic solvent is used. In order to overcome this limitation, a typical drying process is recently being replaced with a supercritical drying process.

SUMMARY

The present disclosure provides an apparatus and method for drying a substrate, which prevents a breakage of the substrate by reducing particles occurring when a supercritical fluid is supplied to a process chamber.

The present disclosure also provides an apparatus and method for drying a substrate, which shortens the process time and improves the process efficiency by quickly supplying and discharging a supercritical fluid.

Embodiments of the inventive concept provide apparatuses for drying a substrate, including: a housing providing a space in which a drying process is performed; a substrate support member provided in the housing to support the substrate; a fluid supply member including a supply line for supplying a process fluid of a supercritical state to the housing; and a discharge member including a discharge line for discharging the process fluid from the housing, wherein the supply line includes: a first supply line provided to supply the process fluid to the housing at a first supply flow rate; and a second supply line provided to supply the process fluid to the housing at a second supply flow rate.

In some embodiments, the supply line may include: a front supply line connected to a storage part of the process fluid; and a rear supply line connected to the housing. Here, the first supply line and the second supply line may be connected in parallel to each other, and may connect between the front supply line and the rear supply line.

In other embodiments, the first supply line may include a first flow control valve that controls the process fluid to flow at a first supply flow rate. The second supply line may include a second flow control valve that controls the process fluid to flow at a second supply flow rate. Also, the first flow control valve and the second flow control valve may be controlled such that the second supply flow rate is greater than the first supply flow rate.

In still other embodiments, the supply line may further include a third supply line provided with a third flow control valve that controls the process fluid to flow at a third supply flow rate, and the third flow control valve may be controlled such that the third supply flow rate is greater than the second supply flow rate.

In even other embodiments, the supply line further may include a controller that controls the flow rate of the flow control valve, and the controller may control an opening degree of the second flow control valve during the drying process such that the flow rate of the process fluid passing through the supply line is controlled.

In other embodiments of the inventive concept, apparatuses for drying a substrate include: a housing providing a space in which a drying process is performed; a substrate support member provided in the housing to support the substrate; a fluid supply member including a supply line for supplying a process fluid of a supercritical state to the housing; and a discharge member including a discharge line for discharging the process fluid from the housing, wherein the discharge line includes: a first discharge line provided to discharge the process fluid from the housing at a first discharge flow rate; and a second discharge line provided to discharge the process fluid from the housing at a second discharge flow rate.

In some embodiments, the discharge line may further include: a front discharge line connected to the housing; and a rear discharge line connected to a recycling apparatus for the process fluid, and the first discharge line and the second discharge line may be connected in parallel to each other, and may connect between the front discharge line and the rear discharge line.

In other embodiments, the first discharge line may include a first flow control valve that controls the process fluid to flow at a first discharge flow rate. The second discharge line may include a second flow control valve that controls the process fluid to flow at a second discharge flow rate. Also, the first flow control valve and the second flow control valve may be controlled such that the first discharge flow rate is greater than the second discharge flow rate.

In still other embodiments, the discharge line further may include a third discharge line provided with a third flow control valve that controls the process fluid to flow at a third discharge flow rate, and the third flow control valve may be controlled such that the third discharge flow rate is greater than the second discharge flow rate.

In still other embodiments of the inventive concept, methods for drying a substrate by controlling a flow rate of a process fluid of a supercritical state supplied into a housing to control an internal pressure of the housing include: supplying, at an initial stage, the process fluid into the housing at a first supply flow rate; and supplying, at a late stage, the process fluid into the housing at a second supply flow rate, wherein the first supply flow rate is smaller than the second supply flow rate.

In some embodiments, the supplying of the process fluid at the second supply flow rate may include supplying the process fluid at the second supply flow rate when the internal pressure of the housing reaches a predetermined pressure by supplying the process fluid into the housing at the first supply flow rate.

In other embodiments, the supplying of the process fluid at the first supply flow rate may include supplying the process fluid into the housing through a lower surface of the housing, and the supplying of the process fluid at the second supply flow rate may include supplying the process fluid into the housing through an upper surface of the housing.

In still other embodiments, the supplying of the process fluid at the first supply flow rate may include supplying the process fluid into the housing through an lower surface of the housing, and the supplying of the process fluid at the second supply flow rate may include supplying the process fluid into the housing simultaneously through both upper surface and lower surface of the housing.

In even other embodiments, in the supplying of the process fluid at the first supply flow rate and the supplying of the process fluid at the second supply flow rate, the process fluid may be supplied into the housing through different supply lines, respectively.

In yet other embodiments, the flow rate of the process fluid may be adjusted by controlling a flow control valve provided in the supply line.

In further embodiments, the flow rate of the process fluid and the internal pressure of the housing may be adjusted by controlling the flow control valve during the supply of the process fluid.

In still further embodiments, the method may further include supplying the process fluid at a third supply flow rate. Here, when the internal pressure of the housing reaches a predetermined pressure by supplying the process fluid to the housing at the first supply flow rate, the process fluid may be supplied at the third supply flow rate. Also, when the internal pressure of the housing reaches another predetermined pressure, the process fluid may be supplied at the second supply flow rate.

In even other embodiments of the inventive concept, methods for drying a substrate by controlling a flow rate of a process fluid of a supercritical state discharged from a housing to control an internal pressure of the housing include: discharging, at an initial stage, the process fluid from the housing at a first discharge flow rate; and discharging, at a late stage, the process fluid into the housing at a second discharge flow rate, wherein the first discharge flow rate is smaller than the second discharge flow rate.

In some embodiments, the discharging of the process fluid at the second discharge flow rate may include discharging the process fluid at the second discharge flow rate when the internal pressure of the housing reaches a predetermined pressure by discharging the process fluid from the housing at the first discharge flow rate.

In other embodiments, in the discharging of the process fluid at the first discharge flow rate and the discharging of the process fluid at the second discharge flow rate, the process fluid may be discharged from the housing through different discharge lines, respectively.

In still other embodiments, the flow rate of the process fluid may be adjusted by controlling a flow control valve provided in a supply line In even other embodiments, the method may further include discharging the process fluid at a third discharge flow rate. Here, when the internal pressure of the housing reaches a predetermined pressure by discharging the process fluid from the housing at the first discharge flow rate, the process fluid may be discharged at the third discharge flow rate. Also, when the internal pressure of the housing reaches another predetermined pressure, the process fluid may be discharged at the second discharge flow rate.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION OF THE EMBODIMENTS

Exemplary embodiments of the inventive concept will be described below in more detail with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

Hereinafter, exemplary embodiments of the inventive concept will be described in detail with reference to the accompanying drawings.

Hereinafter, a substrate treatment apparatus (100 of FIG. 2) according to an embodiment of the inventive concept will be described in detail.

The substrate treatment apparatus 100 may perform a supercritical process in which a substrate S is treated using a supercritical fluid as a process fluid.

Here, the substrate S is a comprehensive concept that includes all of semiconductor device or Flat Panel Display (FPD) and other substrates used for the manufacturing of products in which circuit patterns are formed on a thin film. Examples of substrates S may include wafers including a silicon wafer, glass substrates, and organic substrates.

The supercritical fluid denotes a phase having the properties of both gas and liquid, which is formed when reaching a supercritical state beyond the critical temperature and pressure. The supercritical fluid is close to a liquid in molecular density, but is close to a gas in viscosity. Thus, since the supercritical fluid is excellent in diffusion, infiltration, and dissolution characteristics, the supercritical fluid is advantageous for chemical reaction. Also, since the supercritical fluid has little surface tension, the supercritical fluid does not apply an interfacial tension to a fine structure.

The supercritical process may be performed using the characteristics of such supercritical fluid. Examples of the supercritical process may include a supercritical drying process and a supercritical etching process. Hereinafter, the supercritical drying process will be exemplified as the supercritical process. However, since this is merely for convenience of explanation, the substrate treatment apparatus 100 may perform a supercritical process other than the supercritical drying process.

The supercritical drying process may be performed by a method of drying the substrate S by dissolving an organic solvent remaining on the circuit pattern of the substrate S with a supercritical fluid. The supercritical drying process is excellent in drying efficiency, and can prevent the pattern collapse. As the supercritical fluid used for the supercritical drying process, a material miscible with an organic solvent may be used. For example, supercritical carbon dioxide (scCO2) may be used as the supercritical fluid.

Figure 1:
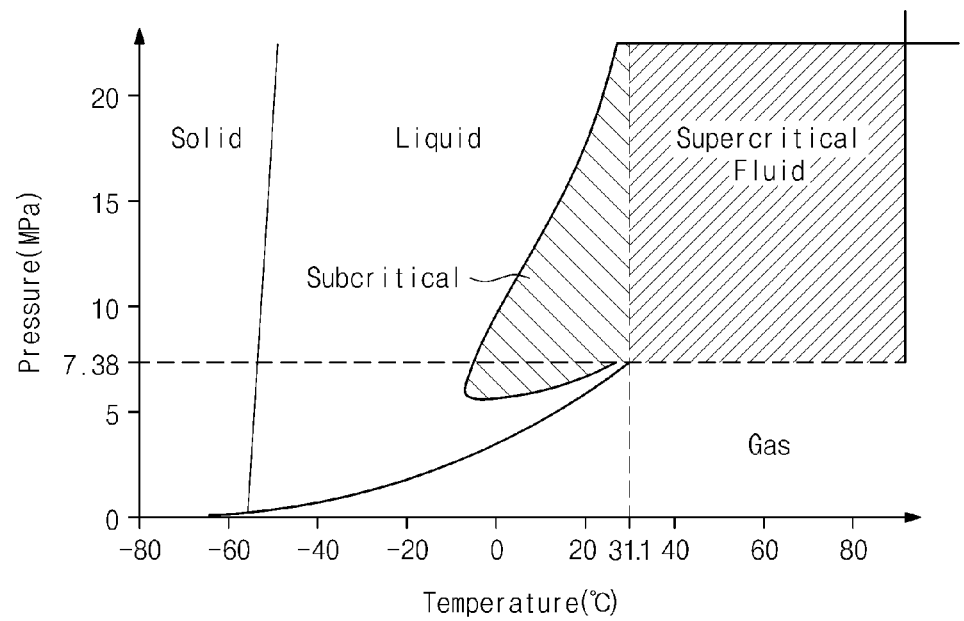
FIG. 1 is a graph illustrating a phase change of a carbon dioxide.

FIG. 1 is a graph illustrating a phase change of carbon dioxide.

Since carbon dioxide has a relatively low critical temperature of about 31.1° C. and a relatively low critical pressure of about 7.38 Mpa, it is easy to make the critical state and control the phase change by adjusting the temperature and the pressure, and the price of carbon dioxide is low. Also, carbon dioxide is nontoxic and harmless to humans, and is nonflammable and inert. Since the supercritical carbon dioxide has a diffusion coefficient about 10 to about 100 times higher than water or other organic solvents, the substitution of the organic solvent is quick. Also, since the supercritical carbon dioxide has little surface tension, the supercritical carbon dioxide has advantageous properties for the drying of the substrate S including fine circuit patterns. Furthermore, carbon dioxide can be recycled as a byproduct of various chemical reactions, and after used for the supercritical drying process, can be converted into gas to be separated from the organic solvent and reused, reducing the load of the environmental contamination.

Hereinafter, a substrate treatment apparatus 100 according to an embodiment of the inventive concept will be described in detail. The substrate treatment apparatus 100 may perform a cleaning process in addition to a supercritical drying process.

Figure 2:
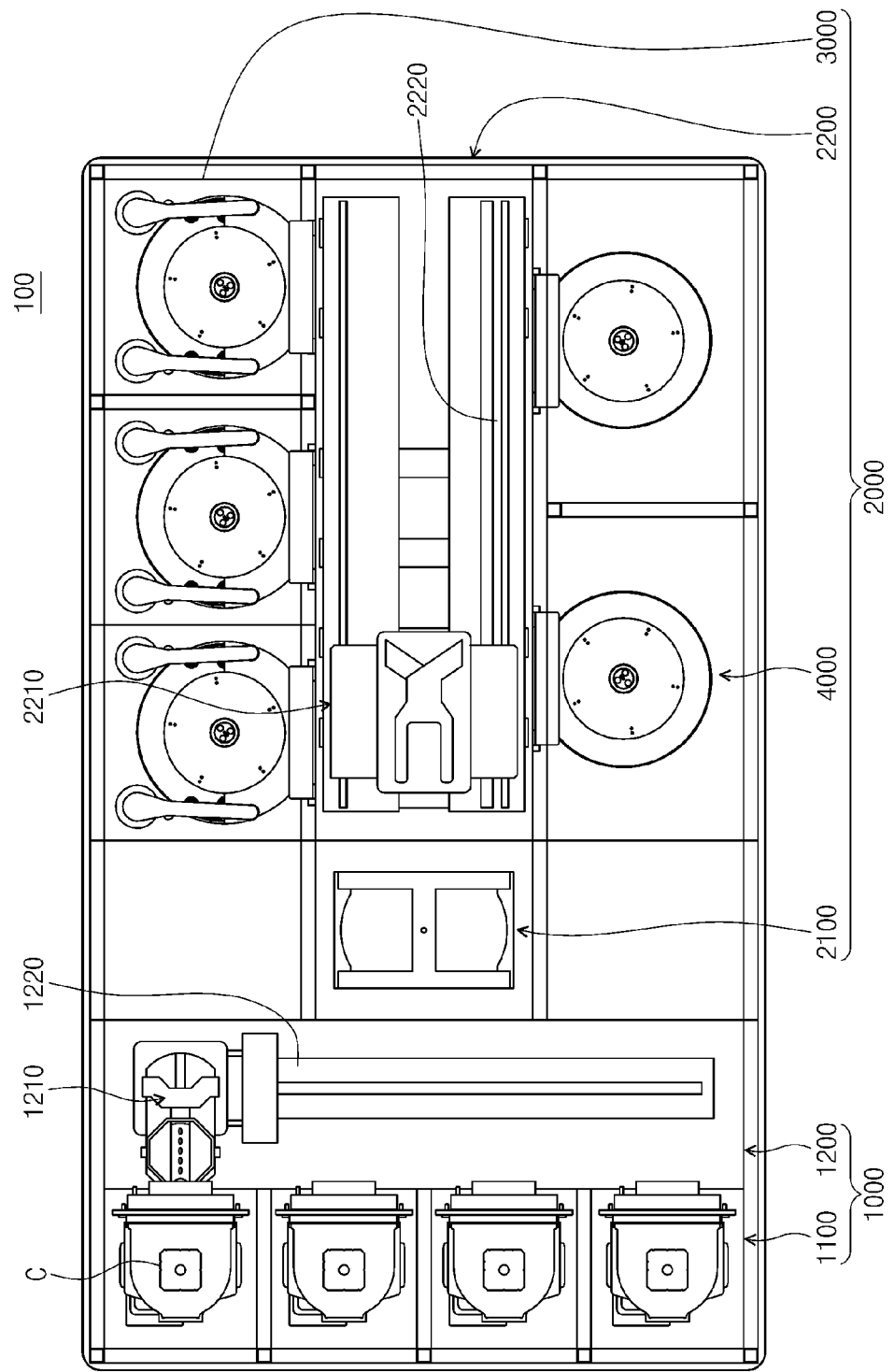
FIG. 2 is a plan view illustrating a substrate treatment apparatus according to an embodiment of the inventive concept.

FIG. 2 is a plan view illustrating a substrate treatment apparatus according to an embodiment of the inventive concept.

Referring to FIG. 2, the substrate treatment apparatus 100 may include an index module 1000 and a process module 2000.

The index module 1000 may receive a substrate S and send the substrate S to the process module 2000, and the process module 2000 may perform a supercritical drying process.

The index module 1000, which is an Equipment Front End Module (EFEM), may include a load port 1100 and a transfer frame 1200.

A container C may be placed on the load port 1100. A Front Opening Unified Pod (FOUP) may be used as the container C. The container C may be brought onto the load port 1100 from the outside or may be brought from the load port 1100 to the outside by an Overhead Transfer (OHT).

The transfer frame 1200 may transfer the substrate S between the container C and the process module 2000. The transfer frame 1200 may include an index robot 1210 and an index rail 1220. The index robot 1210 may transfer the substrate S while moving on the index rail 1220.

The process module 2000, which is a module actually performing the process, may include a buffer chamber 2100, a transfer chamber 2200, a first process chamber 3000, and a second process chamber 4000.

The buffer chamber 2100 may provide a space where the substrate S transferred between the index module 1000 and the process module 2000 temporarily stays. The buffer chamber 2100 may be provided with a buffer slot on which the substrate S is placed.

The transfer chamber 2200 may transfer the substrate S between the buffer chamber 2100, the first process chamber 3000, and the second process chamber 4000, which are disposed around the transfer chamber 2200. The transfer chamber 2200 may include a transfer robot 2210 and a transfer rail 2220. The transfer robot 2210 may transfer the substrate S while moving on the transfer rail 2220.

The first process chamber 3000 and the second process chamber 4000 may perform a cleaning process. In this case, the cleaning process may be sequentially performed in the first process chamber 3000 and the second process chamber 4000. For example, a chemical process, a rinse process, and an organic solvent process of the cleaning process may be performed in the first process chamber 3000, and a supercritical drying process may be performed in the second process chamber 4000.

The first process chamber 3000 and the second process chamber 4000 may be disposed on the side surface of the transfer chamber 2200. For example, the first process chamber 3000 and the second process chamber 4000 may be disposed on different side surfaces of the transfer chamber 2200 so as to face each other.

Also, the first process chamber 300 and the second process chamber 4000 may be provided in plurality to the process module 2000. The plurality of process chambers 3000 and 4000 may be disposed on the side surface in a row, or may be stacked in a vertical direction, or may be disposed in their combination manner.

The disposition of the first process chamber 3000 and the second process chamber 4000 is not limited to the abovemention example, but may be appropriately modified in consideration of various factors such as the process efficiency or the footprint of the substrate treatment apparatus 100.

Hereinafter, the first process chamber 3000 will be described in detail.

Figure 3:
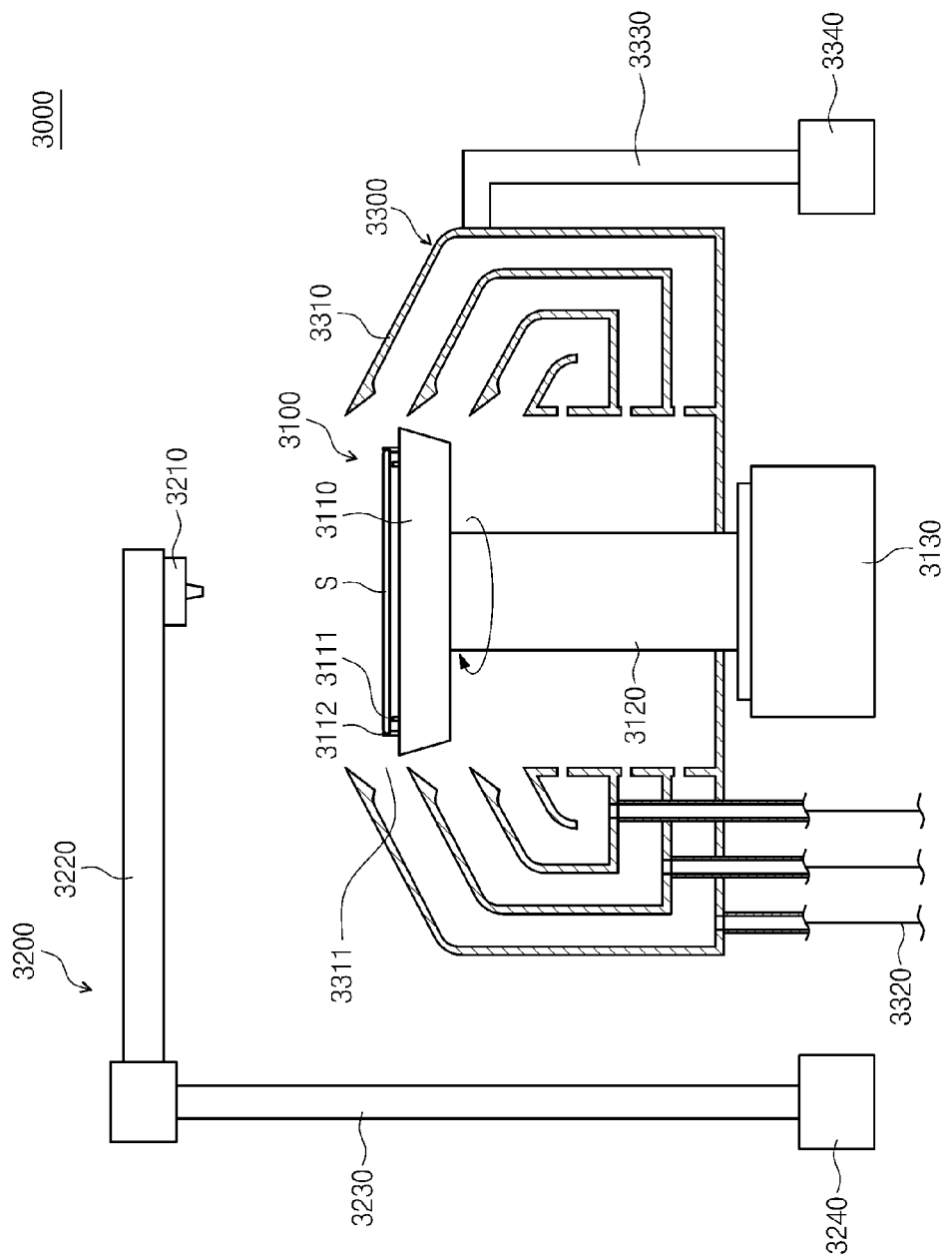
FIG. 3 is a cross-sectional view illustrating a first process chamber of FIG. 2.

FIG. 3 is a cross-sectional view illustrating a first process chamber of FIG. 2.

The first process chamber 3000 may perform the chemical process, the rinse process, and the organic solvent process. Also, the first process chamber 3000 may selectively perform only a portion of these processes. Here, the chemical process may be a process for removing foreign substances on the substrate S by providing a cleaning agent to the substrate S, and the rinse process may be a process for rinsing the cleaning agent remaining on the substrate S by providing a rinsing agent to the substrate S. The organic solvent process may be a process for substituting the rinsing agent remaining between circuit patterns on the substrate S with an organic solvent having a low surface tension by providing the organic solvent to the substrate S.

Referring to FIG. 3, the first process chamber 3000 may include a support member 3100, a nozzle member 3200, and a recovery member 3300.

The support member 3100 may support the substrate S, and may rotate the substrate S that is supported. The support member 3100 may include a support plate 3110, a support pin 3111, a chucking pin 3112, a shaft 3120, and a rotation driver 3130.

The support plate 3110 may have an upper surface of the same or similar shape as the substrate S. The support pin 3111 and the chucking pin 3112 may disposed on the upper surface of the support plate 3110. The support pin 3111 may support the substrate S, and the chucking pin 3112 may fix the substrate S that is supported.

The shaft 3120 may be connected to a lower portion of the support plate 3110. The shaft 3120 may receive a rotary force from the rotation driver 3130 to rotate the support plate 3110. Thus, the substrate S seated on the support plate 3110 may rotate. In this case, the chucking pin 3112 may prevent the substrate S from being deviated from the regular location.

The nozzle member 3200 may spray a chemical on the substrate S. The nozzle member 3200 may include a nozzle 3210, a nozzle bar 3220, a nozzle shaft 3230, and a nozzle shaft driver 3240.

The nozzle 3210 may spray a chemical on the substrate S seated on the support plate 3110. The chemical may include a cleaning agent, a rinsing agent, and an organic solvent. Here, as the cleaning agent, a hydrogen peroxide ($H_2O_2$) solution, ammonia ($NH_4OH$), hydrochloric acid ($HCl$), or sulfuric acid ($H_2SO_4$) mixed with a hydrogen peroxide ($H_2O_2$) solution, or hydrofluoric acid solution may be used. Also, as the rinsing agent, pure water may be used. As the organic solvent, the solution or gas of ethylglycol, 1-propanol, tetra hydraulic franc, 4-hydroxyl, 4-methyl, 2-pentanone, 1-butanol, 2-butanol, methanol, ethanol, n-propyl alcohol, and demethylether may be used.

The nozzle 3210 may be disposed under one end of the nozzle bar 3220. The nozzle bar 3220 may be coupled to the nozzle shaft 3230. The nozzle shaft 3230 may be provided so as to be vertically movable or rotatable. The nozzle shaft driver 3240 may control the location of the nozzle 3210 by vertically moving or rotating the nozzle shaft 3230.

The recovery member 3300 may recover the chemical supplied to the substrate S. When the chemical is supplied to the substrate S via the nozzle member 3200, the support member 3100 may rotate the substrate S to allow the chemical to be evenly supplied to the whole region of the substrate S. When the substrate S rotates, the chemical may be dispersed from the substrate S. The chemical that is dispersed may be recovered by the recovery member 3300.

The recovery member 3300 may include a recovery container 3310, a recovery line 3320, a rising & falling bar 3330, and a rising & falling driver 3340.

The recovery container 3310 may be provided in a circular ring shape that surrounds the support plate 3110. The recovery container 3310 may be provided in plurality. The plurality of recovery containers 3310 may be provided in a ring shape that sequentially becomes distant from the support plate 3110 when viewed from the top. The recovery container 3310 that is farther from the support plate 3110 may have a height greater than that of the recovery container 3310 closer to the support plate 3110. Thus, a recovery opening 3311 may be formed between the recovery containers 3310 to receive the chemical that is dispersed from the substrate S.

The recovery line 3320 may be disposed under the recovery container 3310. The recovery line 3320 may supply the chemical recovered to the recovery container 3310 to a chemical recycling system (not shown) for recycling the chemical.

The rising & falling bar 3330 may be connected to the recover container 3310 and receive power from the rising & falling driver 3340 to vertically move the recovery container 3310. When the recovery container 3310 is provided in plurality, the rising & falling bar 3330 may be connected to the outermost recovery container 3310. The rising & falling driver 3340 may vertically move the recover container 3310 through the rising & falling bar 3330 to select the recovery opening 3311 for receiving the dispersed chemical from the plurality of recovery containers 3311.

Figure 4:
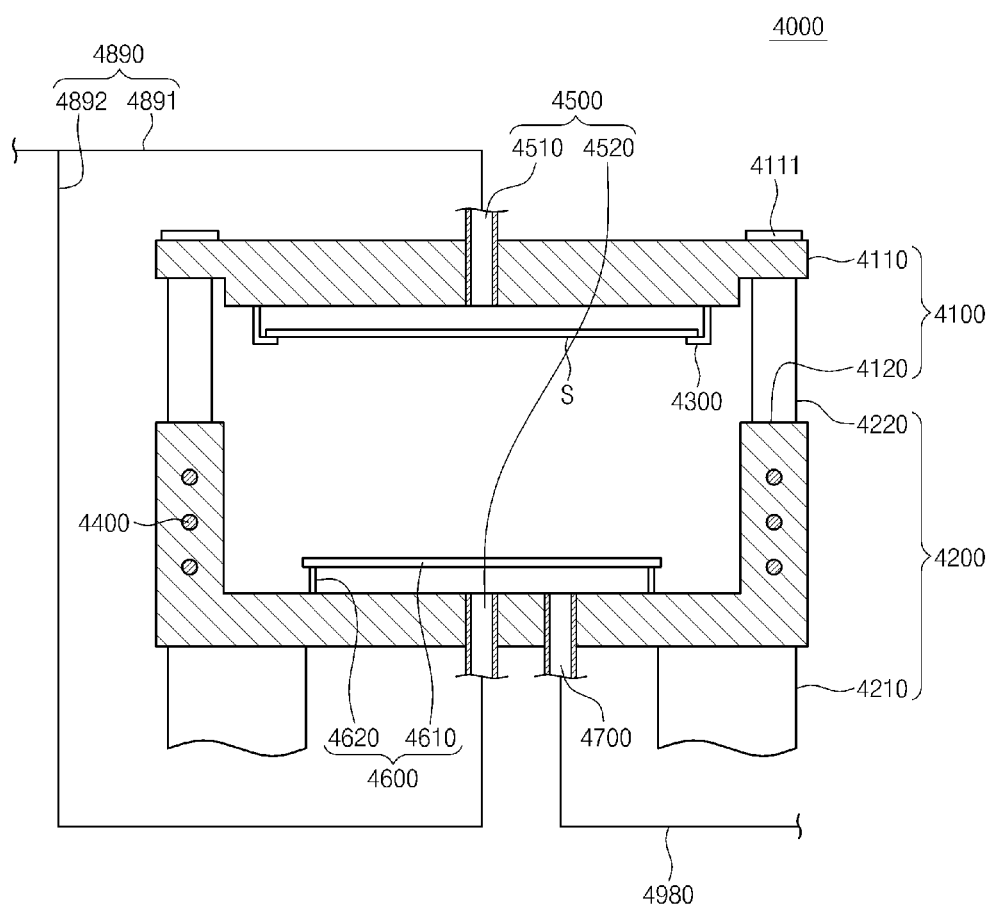
FIG. 4 is a cross-sectional view illustrating a second process chamber of FIG. 2 according to an embodiment of the inventive concept.

FIG. 4 is a cross-sectional view illustrating a second process chamber of FIG. 2 according to an embodiment of the inventive concept.

Referring to FIG. 4, the second process chamber may include a housing 4100, a rising & falling member 4200, a support member 4300, a heating member 4400, a supply port 4500, a blocking member 4600, and a discharge port 4700.

The second process chamber 4000 may perform a supercritical drying process using a supercritical fluid. As described above, the process performed in the second process chamber 4000 may be a supercritical process other than the supercritical drying process. Furthermore, the second process chamber 4000 may also perform the process using other process fluids instead of the supercritical fluid.

The housing 4100 may provide a space where the supercritical drying process is performed. The housing 4100 may be formed of a material that can withstand a high pressure equal to or greater than a critical pressure.

The housing 4100 may be provided in a structure that is divided into an upper part and a lower part by including an upper housing 4110 and a lower housing 4120 disposed under the upper housing 4110.

The upper housing 4110 may be fixedly disposed, but the lower housing 4120 may be disposed so as to be vertically movable. When the lower housing 4120 moves downward to be spaced from the upper housing 4110, the internal space of the second process chamber 4000 may be opened, and the substrate S may be brought into or out of the internal space of the second process chamber 4000. Here, the substrate brought into the second process chamber 4000 may be in a state where the organic solvent remains after undergoing the organic solvent process in the first process chamber 3000. When the lower housing 4120 moves upward to adhere to the upper housing 4110, the internal space of the second process chamber 4000 may be closed, and the supercritical drying process may be performed therein.

The rising & falling member 4200 may vertical move the lower housing 4120. The rising & falling member 4200 may include a rising & falling cylinder 4210 and a rising & falling rod 4220. The rising & falling cylinder 4210 may be coupled to the lower housing 4120 to generate a vertical driving force, i.e., a rising & falling force. The rising & falling rod 4220 may be inserted into the rising & falling cylinder 4210 at one end thereof, and may extend in a vertically upward direction to be coupled to the upper housing 4110 at the other end thereof. When a driving force is generated in the rising & falling cylinder 4210 by this structure, the rising & falling cylinder 4210 and the rising & falling rod 4220 may relatively rise and fall, allowing the lower housing 4120 coupled to the rising & falling cylinder 4210 to vertically move.

The support member 4300 may support the substrate S between the upper housing 4110 and the lower housing 4120. The support member 4300 may be disposed under the upper housing 4110 to be extended in a vertically downward direction, and may be provided in a structure in which the support member 4300 is orthogonally bent in a horizontal direction at the lower end thereof.

A horizontality control member 4111 may be disposed on the upper housing 4110 under which the support member 4300 is disposed. The horizontality control member 4111 may control the horizontality of the upper housing 4110. When the horizontality of the upper housing 4110 is controlled, the horizontality of the substrate S seated on the support member 4300 disposed under the upper housing 4110 can be controlled. When the substrate S inclines in the supercritical drying process, the organic solvent remaining on the substrate S may flow along the inclination surface. In this case, a specific portion of the substrate S may not be dried, or may be over-dried, causing a damage of the substrate S. The horizontality control member 4111 can prevent the damage of the substrate S by controlling the horizontality of the substrate S.

The heating member 4400 may heat the inside of the second process chamber 4000. The heating member 4400 may heat the supercritical fluid supplied into the second process chamber 4000 to the critical temperature or more to maintain the supercritical fluid phase or restore a liquefied supercritical fluid to the supercritical fluid. The heating member 4400 may be embedded in at least one wall of the upper housing 4110 and the lower housing 4120. For example, the heating member 4400 may be a heater that receives power from the outside to generate heat.

The supply port 4500 may supply a supercritical fluid to the second process chamber 4000. The supply port 4500 may include an upper supply port 4510 and a lower supply port 4520. The upper supply port 4510 may be formed in the upper housing 4110 to supply the supercritical fluid to the upper surface of the substrate S supported by the support member 4300. The lower supply port 4520 may be formed in the lower housing 4120 to supply the supercritical fluid to the lower surface of the substrate S supported by the support member 4300.

In this case, the lower supply port 4520 may first supply the supercritical fluid, and then upper supply port 4510 may supply the supercritical fluid. Since the supercritical drying process can be performed in a state where the internal pressure of the second process chamber 4000 is less than the critical pressure at an initial stage, the supercritical fluid supplied into the second process chamber 4000 may be liquefied. Accordingly, at an initial stage of the supercritical drying process, when the supercritical fluid is supplied to the supply port 4510, the supercritical fluid may be liquefied and drop down on the substrate S, causing a damage of the substrate S. When the supercritical fluid is supplied to the second process chamber 4000 via the lower supply port 4520 and the internal pressure of the second process chamber 4000 reaches the critical pressure, the upper supply port 4510 may start to supply the supercritical fluid, thereby preventing the supplied supercritical fluid from being liquefied and dropped on the substrate S.

The blocking member 4600 may block the supercritical fluid supplied through the supply port 4500 from being directly sprayed to the substrate S. The blocking member 4600 may include a blocking plate 4610 and a support 4620.

At an initial stage of the supercritical drying process, when the supercritical fluid is supplied through the lower supply port 4520, the internal pressure of the housing 4100 may be low. Accordingly, the supercritical fluid that is supplied may be sprayed at a high speed. Thus, when the supercritical fluid sprayed at a high speed directly reaches the substrate S, leaning in which a portion of the substrate S contacting the sprayed supercritical fluid is bent may occur due to the physical pressure of the supercritical fluid. Also, the substrate S may be shaken by a spray force of the supercritical fluid, causing the organic solvent remaining on the substrate S to flow and thus damaging circuit patterns of the substrate S.

Accordingly, the blocking plate 4610 disposed between the lower supply port 4520 and the support member 4300 may block the supercritical fluid from being spray directly on the substrate S, preventing a damage of the substrate S due to the physical force of the supercritical fluid.

Selectively, the blocking member 4600 may be excluded from the second process chamber 4000.

The discharge port 4700 may discharge the supercritical fluid from the second process chamber 400.

The discharge port 4700 may be formed in the lower housing 4120. At a late stage of the supercritical drying process, the supercritical fluid may be discharged from the second process chamber 4000, and thus the internal pressure of the second process chamber 4000 may decrease to the critical pressure or less, liquefying the supercritical fluid. The liquefied supercritical fluid may be discharged by gravity through the discharge port 4700 formed in the lower housing 4120.

Figure 5:
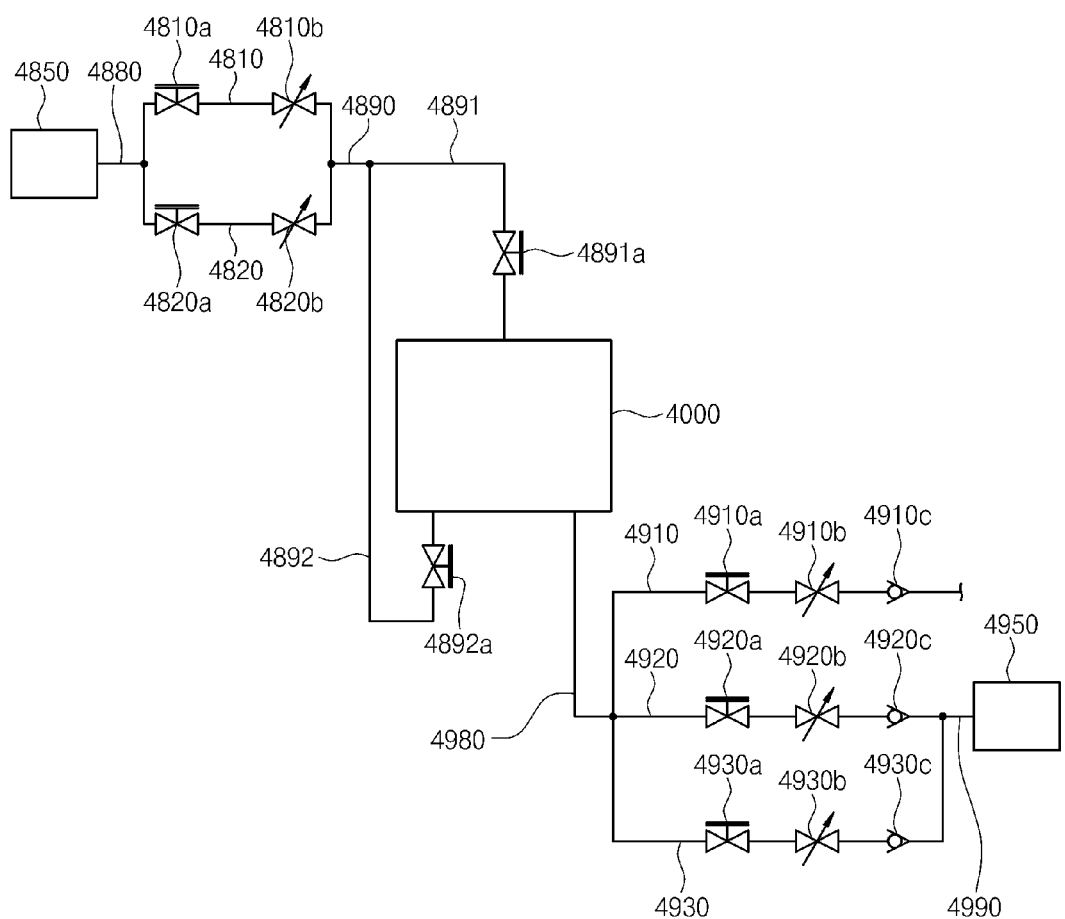
FIG. 5 is a view illustrating a substrate drying apparatus in which process fluid supply and discharge lines are connected to the second process chamber of FIG. 2 according to an embodiment of the inventive concept.

Hereinafter, a substrate drying apparatus in which the supercritical fluid is supplied and discharged according to an embodiment of the inventive concept will be described in detail. FIG. 5 is a view illustrating a substrate drying apparatus in which process fluid supply and discharge lines are connected to the second process chamber of FIG. 2 according to an embodiment of the inventive concept.

Referring to FIG. 5, the supercritical fluid may be supplied into the housing 4100 of the second process chamber 4000 via a supply line 4800, and may be discharged out of the housing 4100 of the second process chamber 4000 via a discharge line 4900.

The supply line 4800 may include a front supply line 4880, rear supply lines 4890, 4891 and 4892, a first supply line 4810, and a second supply line 4820.

One end of the front supply line 4880 may be connected to the storage tank 4850, and one ends of the first and second rear supply lines 4891 and 4892 may be connected to the second process chamber 4000. The first supply line 4810 and the second supply line 4820 are connected in parallel to each other, and may connect between the front supply line 4880 and the rear supply line 4890.

The front supply line 4880 may connect between the storage 4850 and the first and second supply lines 4810 and 4820. One end of the front supply line 4880 may be connected to the storage tank 4850, and the other end thereof may be connected to a branch point of the first supply line 4810 and the second supply line 4820 that are connected in parallel. The supercritical fluid may move from the storage tank 4850 to the branch point of the first supply line 4810 and the second supply line 4820 through the front supply line 4880.

The first supply line 4810 and the second supply line 4820 may be connected in parallel to each other. One branch point of the first supply line 4810 and the second supply line 4820 may be connected to the front supply line 4880, and the other branch point thereof may be connected to the rear supply line 4890.

The first supply line 4810 may include a first shut-off valve 4810*a* and a first flow control valve 4810*b*. The first shut-off valve 4810*a* may control the supply of the supercritical fluid from the front supply line 4880 to the first supply line 4810. The first flow control valve 4810*b* may control the flow rate of the supercritical fluid flowing into the first supply line 4810. The first flow control valve 4810*b* may control the pressure of the supercritical fluid flowing into the second process chamber 4000 by allowing the supercritical fluid to flow at a predetermined flow rate.

The second supply line 4820 may include a second shut-off valve 4820*a* and a second flow control valve 4820*b*. The second shut-off valve 4820*a* may control the supply of the supercritical fluid from the front supply line 4880 to the second supply line 4820. The second flow control valve 4820*b* may control the flow rate of the supercritical fluid flowing into the second supply line 4820. The second flow control valve 4820*b* may control the pressure of the supercritical fluid flowing into the second process chamber 4000 by allowing the supercritical fluid to flow at a predetermined flow rate. The second flow control valve 4820*b* and the first flow control valve 4810*b* may be configured to differ from each other in the flow rate of the supercritical fluid flowing in the first supply line 4810 and the second supply line 4820. In an embodiment, the second supply flow rate may be greater than the first supply flow rate.

At an initial stage of the supply process of the supercritical fluid, the supercritical fluid flowing into the second process chamber may be provided through the first supply line 4810. Since the flow rate of the supercritical fluid through the first supply line 4810 is smaller than that of the second supply line 4820, the initial pressurization of the supercritical fluid in the second process chamber 4000 may be low. Thus, particles may be prevented from occurring in the second process chamber 4000. Also, the substrate S may be prevented from being damaged due to the initial pressurization of the supercritical fluid. When the internal pressure of the second process chamber 4000 reaches a predetermined pressure due to the supply of the supercritical fluid through the first supply line 4810, a larger amount of supercritical fluid may be supplied through the second supply line 4820. Thus, the process time can be shortened, and the process efficiency can be improved.

The rear supply lines 4890, 4891 and 4892 may supply the supercritical fluid flowing at different flow rates through the first supply line 4810 and the second supply line 4820 into the second process chamber 4000. The rear supply line 4890 may include the first rear supply line 4891 connected to the upper part of the second process chamber 4000 and the second rear supply line 4892 connected to the lower part of the second process chamber 4000. In an embodiment, when the substrate S is located at an upper side of the inside of the second process chamber 4000, the supercritical fluid from the first supply line 4810 may be provided to the lower part of the second process chamber 4000 through the second rear supply line 4892. This is for preventing a damage of the substrate S due to the initial pressurization by supplying the supercritical fluid to the lower supply port 4520 distant from the substrate S at an initial stage of the supercritical fluid supply. Accordingly, when reaching a predetermined pressure by the supply of the supercritical fluid through the second rear supply line 4892, a larger amount of supercritical fluid may be supplied through the first rear supply line 4891.

The discharge line 4900 may include a front discharge line 4980, a rear discharge line 4990, a first discharge line 4910, a second discharge line 4920, and a third discharge line 4930.

The front discharge line 4980 may connected between the second process chamber 4000 and the first to third discharge lines 4910, 4920 and 4930. One end of the front discharge line 4980 may be connected to the second process chamber 4000, and the other end thereof may be connected to a branch point of the first to third discharge lines 4910, 4920 and 4930 that are connected in parallel. The supercritical fluid may flow from the second process chamber 4000 to the branch point of the first to third discharge lines 4910, 4920 and 4930 through the front discharge line 4980.

The first discharge line 4910, the second discharge line 4920, and the third discharge line 4930 may be connected in parallel to one another.

One end of the first discharge line 4910 may be connected to the branch point of the first discharge line 4910, the second discharge line 4920, and the third discharge line 4930, and the other end thereof may be connected to the outside (not shown). The supercritical fluid may flow to the first discharge line 4910 to be discharged to the outside.

The first discharge line 4910 may include a first shut-off valve 4910*a*, a first flow control valve 4910*b*, and a first check valve 4910*c*. The first shut-off valve 4910*a* may control the supply of the supercritical fluid from the front discharge line 4980 to the first discharge line 4910. The first flow control valve 4910*b* may control the flow rate of the supercritical fluid flowing into the first discharge line 4910. The first flow control valve 4910*b* may control the pressure of the supercritical fluid discharged from the second process chamber 4000 by allowing the supercritical fluid to flow at a predetermined first discharge flow rate. The first check valve 4910*c* may allow the supercritical fluid to flow only in a direction from the second process chamber 4000 to the atmosphere.

One end of the second discharge line 4920 may be connected to the branch point of the first discharge line 4910, the second discharge line 4920, and the third discharge line 4930, and the other end thereof may be connected to the rear discharge line 4990. The second discharge line 4920 may be connected in parallel to the third discharge line 4930.

The second discharge line 4920 may include a second shut-off valve 4920*a*, a second flow control valve 4920*b*, and a second check valve 4920*c*. The second shut-off valve 4920*a* may control the supply of the supercritical fluid from the front discharge line 4980 to the second discharge line 4920. The second flow control valve 4920*b* may control the flow rate of the supercritical fluid flowing into the second discharge line 4920. The second flow control valve 4920b may control the pressure of the supercritical fluid flowing into the second process chamber 4000 by allowing the supercritical fluid to flow at a predetermined second discharge flow rate. The second flow control valve 4920b and the first flow control valve 4910b may be configured to differ from each other in the flow rate of the supercritical fluid flowing in the first discharge line 4910 and the second discharge line 4920. In an embodiment, the first discharge flow rate may be greater than the second discharge flow rate. The second check valve 4920c may allow the supercritical fluid to flow only in a direction of a supercritical fluid recycling apparatus 4950.

One end of the third discharge line 4930 may be connected to the branch point of the first discharge line 4910, the second discharge line 4920, and the third discharge line 4930, and the other end thereof may be connected to the rear discharge line 4990. The second discharge line 4920 may be connected in parallel to the third discharge line 4930. The third discharge line 4930 may be used to discharge the supercritical fluid while repeating the supply and discharge of the supercritical fluid during the drying process.

The third discharge line 4930 may include a third shut-off valve 4930a, a third flow control valve 4930b, and a third check valve 4930c. The third shut-off valve 4930a may control the supply of the supercritical fluid from the front discharge line 4980 to the third discharge line 4930. The third flow control valve 4930b may control the flow rate of the supercritical fluid flowing into the third discharge line 4930. The third flow control valve 4930b may control the pressure of the supercritical fluid flowing into the second process chamber 4000 by allowing the supercritical fluid to flow at a predetermined flow rate. The third check valve 4930c may allow the supercritical fluid to flow only in the direction of the supercritical fluid recycling apparatus 4950.

At an initial stage of the discharge process, the supercritical fluid may be discharged from the second process chamber 4000 through the second discharge line 4920. Since the flow rate of the supercritical fluid through the second discharge line 4920 is smaller than that of the first discharge line 4910, the initial pressure variation of the supercritical fluid in the second process chamber 4000 may be low. Thus, particles may be prevented from occurring in the second process chamber 4000. Also, the substrate S may be prevented from being damaged due to the initial pressurization of the supercritical fluid. When the internal pressure of the second process chamber 4000 reaches a predetermined pressure due to the supply of the supercritical fluid through the second discharge line 4920, a larger amount of supercritical fluid may be supplied through the first discharge line 4910. Thus, the process time can be shortened, and the process efficiency can be improved.

The rear discharge line 4990 may allow the supercritical fluid flowing at different flow rates through the first discharge line 4910 and the second discharge line 4920 to flow to the supercritical fluid recycling apparatus 4950. One side of the rear discharge line 4990 may be connected to the branch point of the first discharge line 4910 and the second discharge line 4920, and the other side thereof may be connected to the supercritical fluid recycling apparatus 4950.

Figure 6:
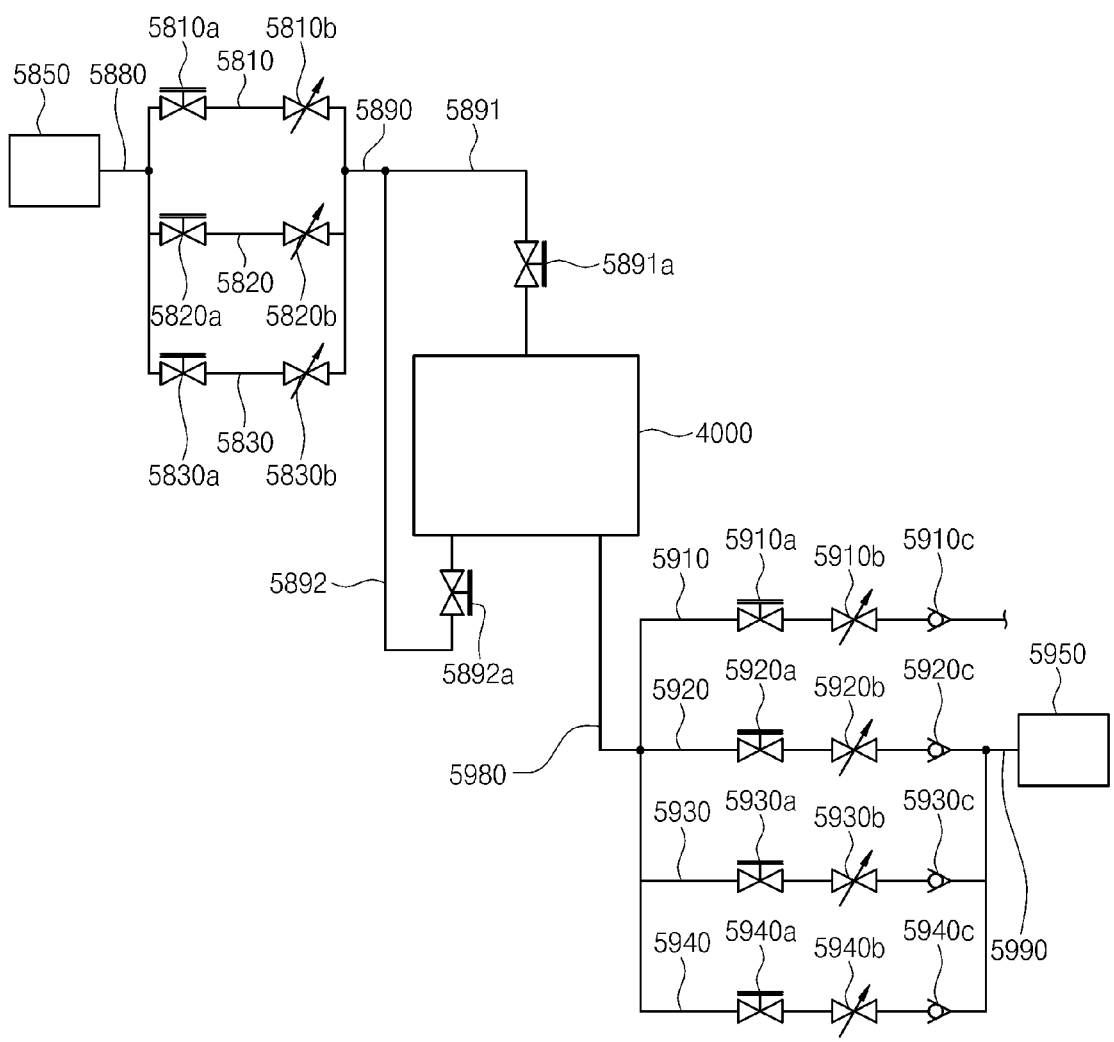
FIG. 6 is a view illustrating a substrate drying apparatus in which process fluid supply and discharge lines are connected to the second process chamber of FIG. 2 according to a modified embodiment of the inventive concept.

Hereinafter, a substrate drying apparatus in which a supercritical fluid is supplied and discharged according to a modified embodiment of the inventive concept will be described in detail. FIG. 6 is a view illustrating a substrate drying apparatus in which process fluid supply and discharge lines are connected to the second process chamber of FIG. 2 according to a modified embodiment of the inventive concept.

Referring to FIG. 6, the supply line 5800 may include a front supply line 5880, a rear supply line 5890, 5891 and 5892, a first supply line 5810, a second supply line 5820, and a third supply line 5830.

The supply line 5800 may further include the third supply line 5830 compared to the supply line 4800 of FIG. 5. The third supply line 5830 may be provided to allow a larger amount of supercritical fluid to flow therein than the first supply line 5810 and the second supply line 5820. At an initial stage of the supercritical fluid supply, the supercritical fluid may be supplied at a low pressure through the first supply line 5810. When reaching a predetermined pressure, a larger amount of supercritical fluid may be supplied through the third supply line 5830. Since the third supply line 5830 supplies more supercritical fluid than the second supply line 5820, the process time can be shortened and the process efficiency can be improved.

The third supply line 5830 may be connected in parallel to the first supply line 5810 and the second supply line 5820. One branch point may be connected to the front supply line 5880 and the other branch point may be connected to the rear supply line 5890.

The third supply line 5830 may include a third shut-off valve 5830a and a third flow control valve 5830b. The third shut-off valve 5830a may control the supply of the supercritical fluid from the front supply line 5880 to the third supply line 5830. The third flow control valve 5830b may control the flow rate of the supercritical fluid flowing into the third supply line 5830. The third flow control valve 5830b may control the pressure of the supercritical fluid flowing into the second process chamber 4000 by allowing the supercritical fluid to flow at a predetermined flow rate. In an embodiment, the third flow control valve 5830b may be configured such that the flow rate of the supercritical fluid flowing in the third supply line 5830 is greater than the flow rate of the supercritical fluid flowing in the second supply line 5820.

The discharge line 5900 may include a front discharge line 5980, a rear discharge line 5990, a first discharge line 5910, a second discharge line 5920, a third discharge line 5930, and a fourth discharge line 5940.

The discharge line 5900 may further include the fourth discharge line 5940 compared to the discharge line 4900 of FIG. 5. The fourth discharge line 5940 may be provided to allow a larger amount of supercritical fluid to flow than the first discharge line 5910 and the second discharge line 5920. At an initial stage of the supercritical fluid discharge, when reaching a predetermined pressure while discharging the supercritical fluid through the first discharge line 5910 such that the pressure variation is low, a larger amount of supercritical fluid may be discharged through the fourth discharge line 5940. Since the fourth discharge line 5940 discharges more supercritical fluid than the first and second discharge lines 5910 and 5920, the discharge time can be shortened and the process efficiency can be improved.

The fourth discharge line 5940 may be connected in parallel to the first discharge line 5910, the second discharge line 5920, and the third discharge line 5930. One branch point may be connected to the front discharge line 5980 and the other branch point may be connected to the rear discharge line 5990.

The fourth discharge line 5940 may include a fourth shut-off valve 5940a, a first discharge flow control valve 5940b, and a fourth check valve 4940c. The fourth shut-off valve 5940*a* may control the supply of the supercritical fluid from the front discharge line 5980 to the fourth discharge line 5940. The first discharge flow control valve 5940*b* may control the flow rate of the supercritical fluid flowing into the fourth discharge line 5940. The first discharge flow control valve 5940*b* may control the internal pressure variation of the second process chamber 4000 by allowing the supercritical fluid to be discharged at a predetermined flow rate. The fourth check valve 4940*c* may allow the supercritical fluid to flow only in the direction of the supercritical recycling apparatus 5950.

Figure 7:
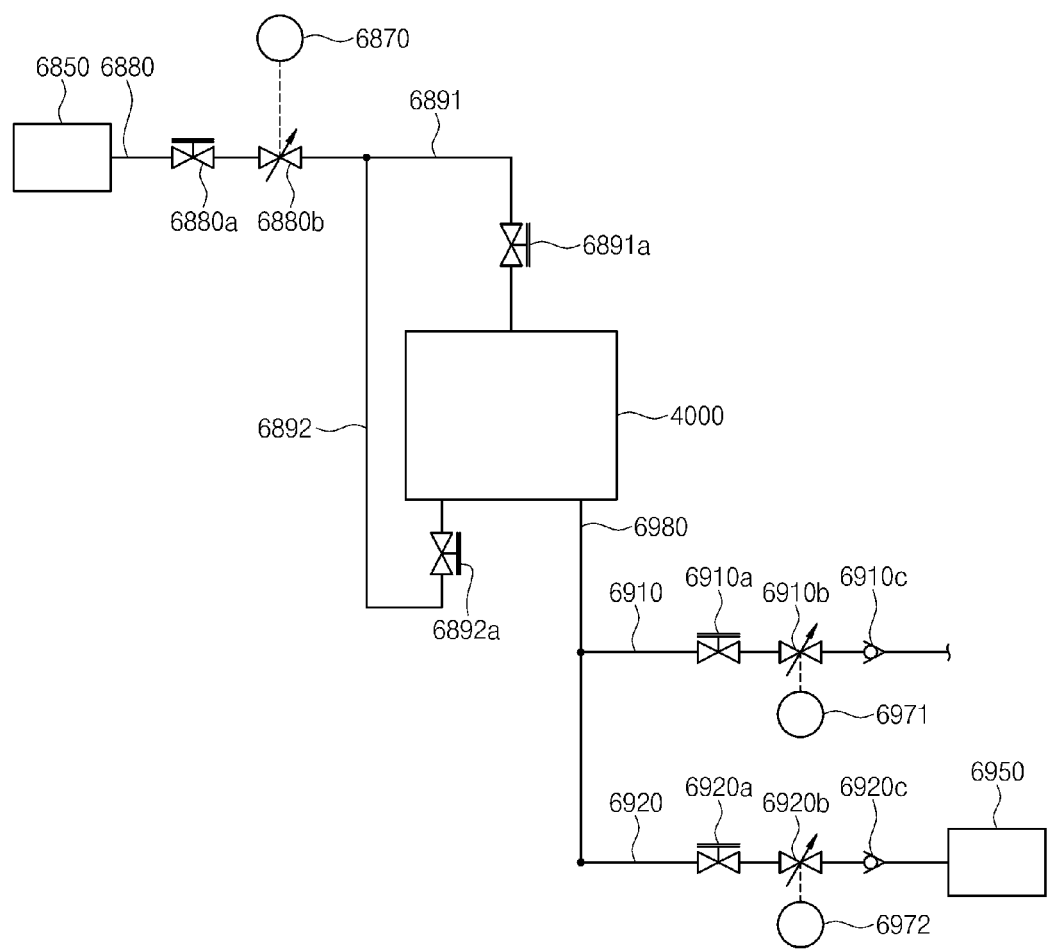
FIG. 7 is a view illustrating a substrate drying apparatus in which process fluid supply and discharge lines are connected to the second process chamber of FIG. 2 according to another embodiment of the inventive concept.

Hereinafter, a substrate drying apparatus in which a supercritical fluid is supplied and discharged according to another embodiment of the inventive concept will be described in detail. FIG. 7 is a view illustrating a substrate drying apparatus in which process fluid supply and discharge lines are connected to the second process chamber of FIG. 2 according to another embodiment of the inventive concept.

Referring to FIG. 7, a supply line 6800 may include a front supply line 6880, rear supply lines 6891 and 6892, and a controller 6870.

The controller 6870 may control the flow rate of the supercritical fluid flowing in the supply line 6800 by controlling a flow control valve 6880*b* on the supply line 6800. The controller 6870 may control the pressure of the supercritical fluid supplied into the second process chamber 4000 by controlling the flow control valve 6880*b* during the supply process of the supercritical fluid. Thus, when the supercritical fluid is supplied into the second process chamber 4000, particles may be prevented from occurring in the second process chamber 4000, and the substrate S may be prevented from being damaged.

The discharge line 6 may include a front discharge line 6980, a first discharge line 6910, a second discharge line 6920, a first controller 6971, and a second controller 6972.

The first and second controllers 6971 and 6972 may control the flow rate of the supercritical fluid flowing in the first and second discharge lines 6910 and 6920 by controlling first and second flow control valve 6910*b* and 6920*b* on the first and second discharge lines 6910 and 6920. The first and second controller 6971 and 6972 may control the pressure variation upon discharging of the supercritical fluid from the second process chamber 4000 by controlling the first and second flow control valves 6910*b* and 6920*b* during the supply process of the supercritical fluid. Thus, particles may be prevented from occurring in the second process chamber 4000 due to a rapid pressure change when the supercritical fluid is discharged from the second process chamber 4000, and the substrate S may be prevented from being damaged.

Hereinafter, a substrate drying method according to an embodiment of the inventive concept will be described using the substrate treatment apparatus 100 described above. However, since this is merely for convenience of explanation, the substrate drying method may be performed using other apparatuses identical or similar to the substrate treatment apparatus 100. Also, a substrate drying method according to an embodiment of the inventive concept can be stored in a computer-readable media in a form of code or program for performing the substrate drying method.

Hereinafter, a substrate treatment method according to an embodiment of the inventive concept will be described in detail with reference to the accompanying drawings. An embodiment of the substrate treatment method relates to the whole of a cleaning process.

Figure 8:
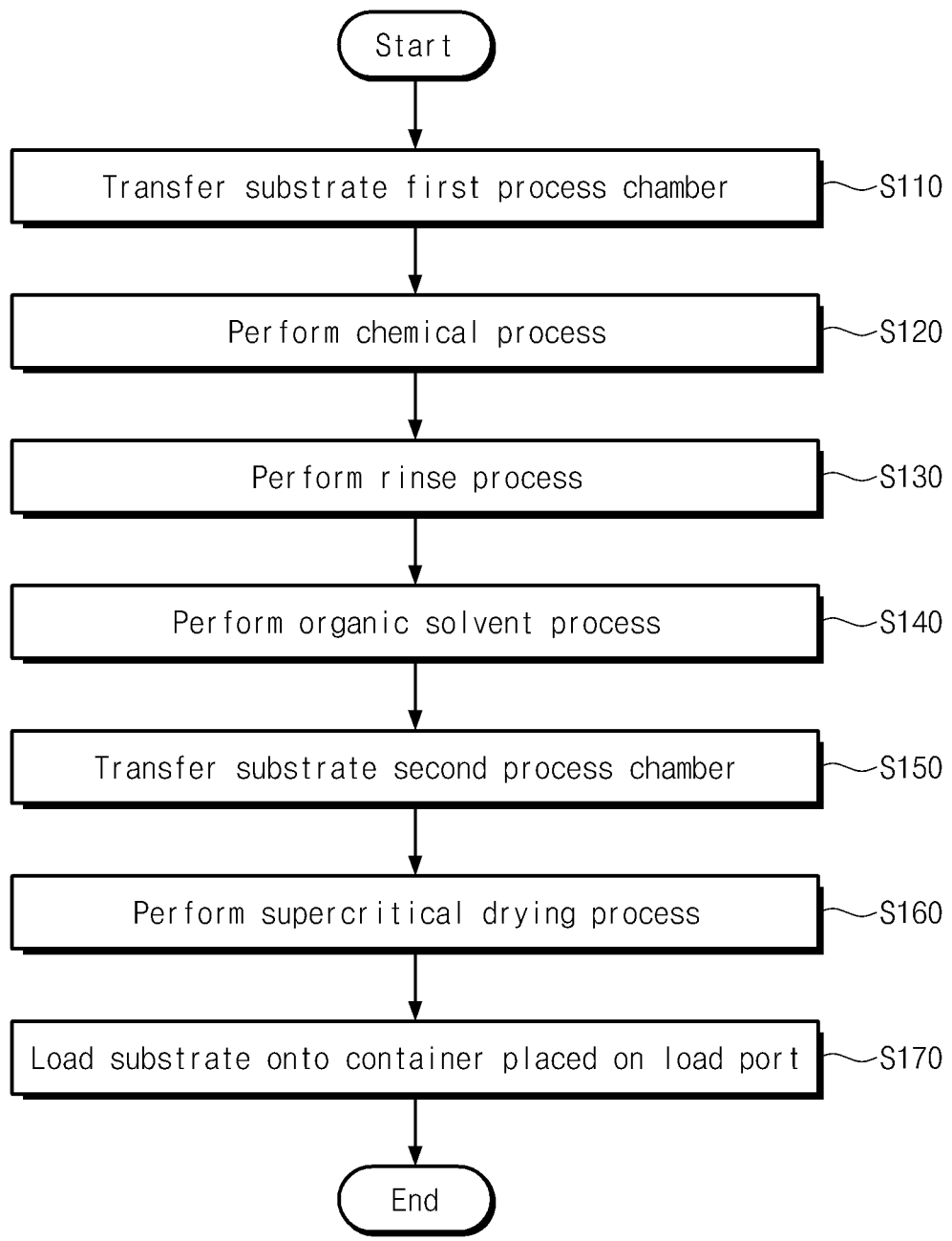
FIG. 8 is a flowchart illustrating a substrate treatment method according to an embodiment of the inventive concept.

FIG. 8 is a flowchart illustrating a substrate treatment method according to an embodiment of the inventive concept.

The substrate treatment method may include transferring a substrate S into a first process chamber 3000 (S110), performing a chemical process (S120), performing a rinse process (S130), performing an organic solvent process (S140), transferring the substrate S into a second process chamber 4000 (S150), performing a supercritical drying process (S160), and loading the substrate S onto a container C placed on a load port 1100. Meanwhile, the above-mentioned processes need not to be performed by the order described above. Accordingly, a process described later may be performed earlier than another process described earlier. The same applies to other embodiments of the substrate treatment method described later. Hereinafter, the substrate treatment method will be described in more detail.

In operation S110, the substrate S may be transferred into the first processing chamber. First, a transfer apparatus such as an overhead transfer may place the container C loaded with the substrate S on the load port 1100. When the container C is placed, an index robot 1210 may unload the substrate S from the container C, and then may load the substrate S in a buffer slot. The substrate S loaded in the buffer slot may be unloaded by a transfer robot 2210, and then may be transferred into the first process chamber 3000. Thereafter, the substrate S may be seated on a support plate 3110.

When the substrate S is transferred into the first process chamber 3000, the chemical process may be performed in operation S120. When the substrate S is placed on the support plate 3110, a nozzle shaft 3230 may be moved and rotated by a nozzle shaft driver 3240, allowing a nozzle 3210 to be located over the substrate S. The nozzle 3210 may spray a cleaning agent on the upper surface of the substrate S. When the cleaning agent is sprayed, foreign substances may be removed from the substrate S. In this case, a rotation driver 3130 may rotate a shaft 3120 to rotate the substrate S. When the substrate S rotates, the cleaning agent may be evenly supplied to the substrate S, and may be dispersed from the substrate S. The cleansing agent that is dispersed may be recovered to the recovery container 3310, and may be sent to a process fluid recycling apparatus (not shown) through a recovery line 3320. In this case, a rising & falling drier 3340 may vertically move the recovery container 3310 by a rising & falling bar such that the cleaning agent that is dispersed can be introduced into one of a plurality of recovery containers 3310.

When foreign substances are sufficiently removed from the substrate S, the rinse process may be performed in operation S130. When the chemical process is finished, foreign substances may be removed from the substrate S, and the cleaning agent may remain on the substrate S. The nozzle 3210 that has sprayed the cleaning agent may be deviated from the substrate S, and another nozzle 3210 may move over the substrate S, and may spray a rinse agent on the upper surface of the substrate S. When the rinse agent is supplied, the cleaning agent remaining on the substrate S may be cleaned. Even during the rinse process, the rotation of the substrate S and the recovery of chemical can be performed. The rising & falling driver 3340 may adjust the height of the recovery container 3310 such that the rinse agent can be introduced into a recovery container 3310 other than the recovery container 3310 that has recovered the cleaning agent.

When the substrate S is sufficiently cleaned, the organic solvent process may be performed in operation S140. When the rinse process is finished, another nozzle 3210 may move over the substrate S, and then may spray organic solvent. When the organic solvent is supplied, the rinse agent on the substrate S may be substituted with the organic solvent. Meanwhile, during the organic solvent process, the substrate S may not rotate or may rotate at a low speed. This is because that when the organic solvent is directly evaporated from the substrate S, an interfacial tension may act on circuit patterns due to the surface tension of the organic solvent, causing a pattern collapse.

When the organic solvent process in the first process chamber is finished, the substrate S may be transferred into a second process chamber 4000 in operation 5150, and the second process chamber 4000 may perform a supercritical drying process. Operations 5150 and 5160 will be described in more detail in another embodiment of the substrate treatment method described later.

When the supercritical drying process is finished, the substrate S may be loaded onto the container C placed on the load port 1100. When the second process chamber 4000 is opened, the transfer robot 2210 may unload the substrate S. The substrate S may be transferred into the buffer chamber 2100, and then may be unloaded from the buffer chamber 2100 by the index robot 1110 to be loaded on the container C.

Hereinafter, a substrate treatment method according to another embodiment of the inventive concept will be described. Another embodiment of the substrate treatment method relates to a method of performing the supercritical drying process by the second process chamber.

Figure 9:
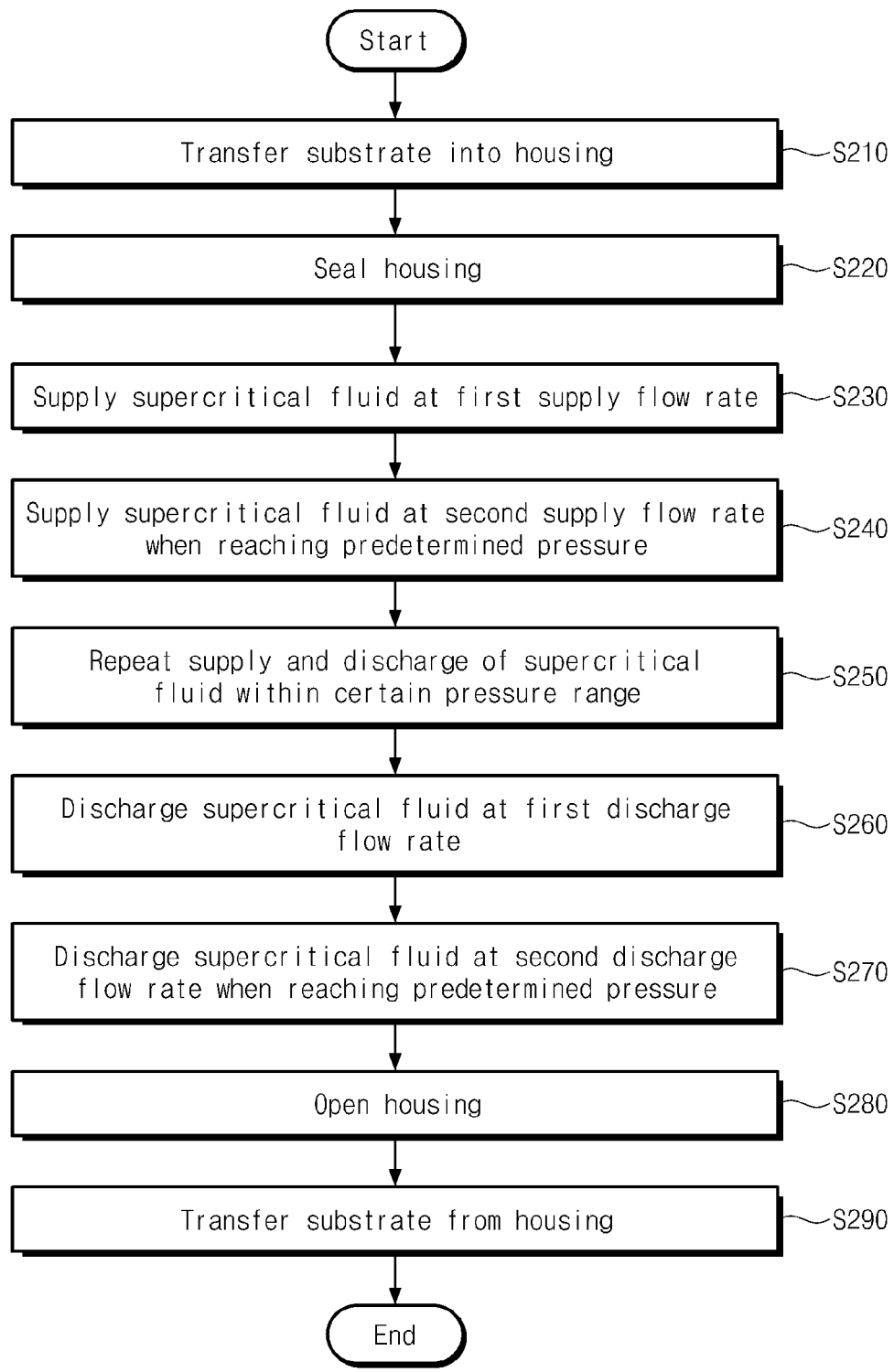
FIG. 9 is a flowchart illustrating a substrate treatment method according to an embodiment of the inventive concept.

FIG. 9 is a flowchart illustrating a substrate treatment method according to an embodiment of the inventive concept.

The substrate treatment method may include transferring a substrate S into a second process chamber 4000 (S210), sealing a housing 4100 (S220), supplying a supercritical fluid at a first supply flow rate (S230), supplying the supercritical fluid at a second supply flow rate when an internal pressure of the second process chamber reaches a predetermined pressure (S240), repeating supply and discharge of the supercritical fluid within a certain internal pressure range of the second process chamber 4000 (S250), discharging the supercritical fluid at a first discharge flow rate (S260), discharging the supercritical fluid at a second discharge flow rate when reaching the predetermined pressure (S270), opening a housing 4100 (S280), and transferring the substrate S from the second process chamber 4000 (S290). Hereinafter, operations S230 to S270 for supplying and discharging the supercritical fluid will be described in more detail.

FIGS. 10 to 14 are views illustrating an operation of the substrate treatment method of FIG. 9.

Figure 10:
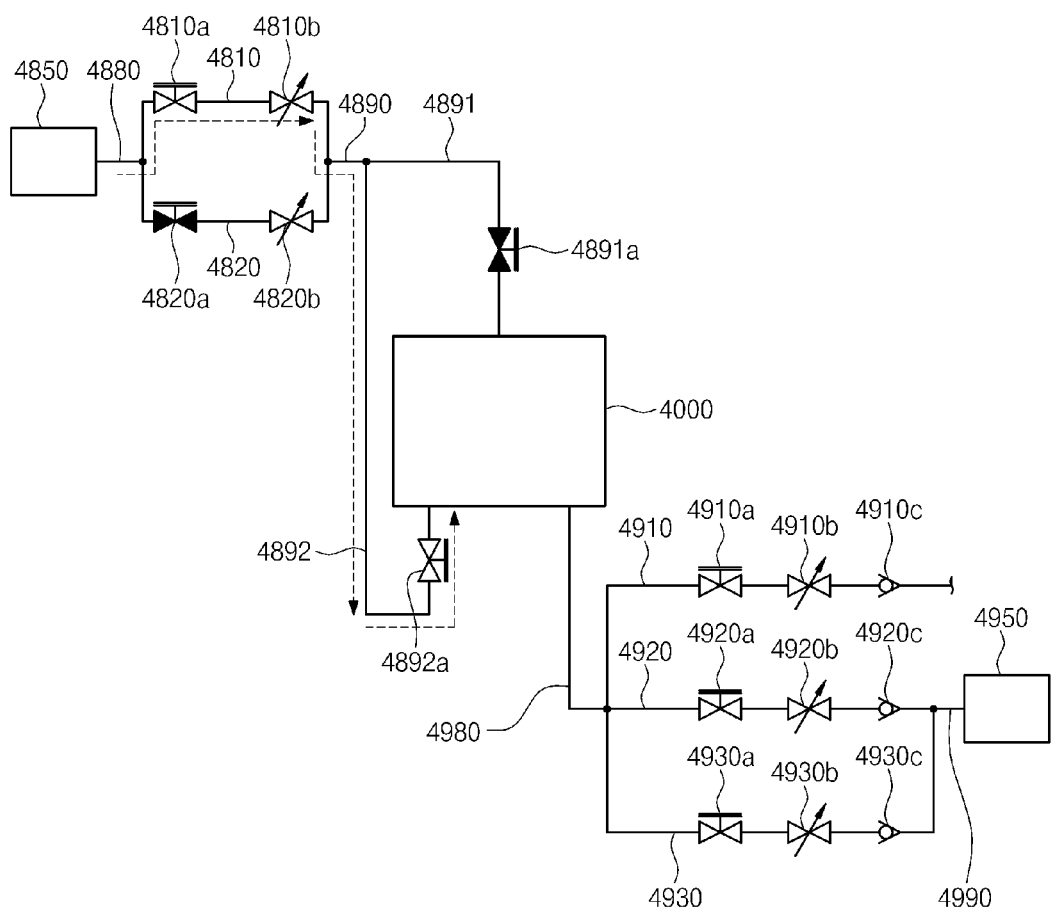
FIGS. 10 to 14 are views illustrating an operation of the substrate treatment method of FIG. 9.

The supply of the supercritical fluid into the second process chamber 4000 at an initial stage of the process will be described as follows. Referring to FIG. 10, at an initial stage where the supercritical fluid is introduced, the first shut-off valve 4810a of the first supply line 4810 and the shut-off valve 4892a of the second rear supply line 4892 may be opened, and the second shut-off valve 4820a of the second supply line 4820 and the shut-off valve 4891a of the first rear supply line 4891 may be closed. Accordingly, the supercritical fluid may be supplied from the storage tank 4850 to the second process chamber 4000 through the front supply line 4880, the first supply line 4810, and the second rear supply line 4892.

At an initial stage of the process, the substrate S may be damaged, or particles may occur in the second process chamber 4000 when the supercritical fluid is introduced into the second process chamber 4000. In order to prevent this limitation, the first flow control valve 4801a of the first supply line 4810 may adjust the flow rate of the supercritical fluid into a first supply flow rate. The first supply flow rate may cause a low pressure variation such that the substrate S is not damaged or particles do not occur upon initial pressurization of the supercritical fluid in the second process chamber 4000. In this case, the supercritical fluid may be supplied to the lower surface of the second process chamber through the second rear supply line 4892 distant from the substrate S in order to prevent a damage of the substrate.

Figure 11:
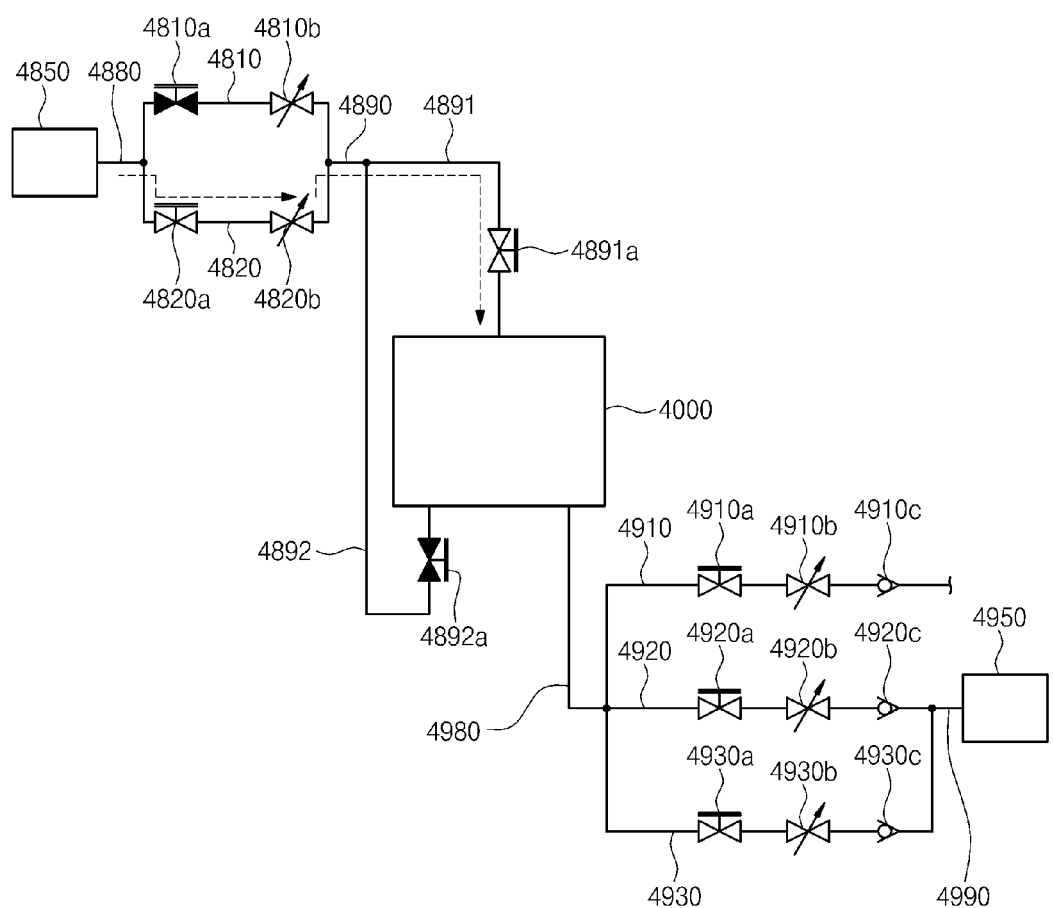

When the internal pressure of the second process chamber 4000 reaches a predetermined pressure due to introduction of the supercritical fluid, a large amount of supercritical fluid may be supplied. Referring to FIG. 11, when the internal pressure of the second process chamber 400 reaches a predetermined pressure due to the supply of the supercritical fluid in FIG. 10, the first shut-off valve 4810a of the first supply line 4810 and the shut-off valve 4892a of the second rear supply line 4892 may be closed, and the second shut-off valve 4820a of the second supply line 4820 and the shut-off valve 4891a of the first rear supply line 4891 may be opened. The supercritical fluid may be supplied into the second process chamber from the storage tank 4850 through the front supply line 4880, the second supply line 4820, and the first rear supply line 4891. In this case, the second supply flow rate of the supercritical fluid passing through the second supply line 4820 may be controlled to be greater than the first supply flow rate of the first supply line 4810. When the internal pressure of the second process chamber 4000 become equal to or greater than a certain pressure, since the substrate S may not be damaged or particles may not occur due to the pressure variation, a large amount of supercritical fluid may be supplied closely to the substrate S. Thus, the drying process time can be shortened, and the efficiency of the drying process can be improved.

Figure 12:
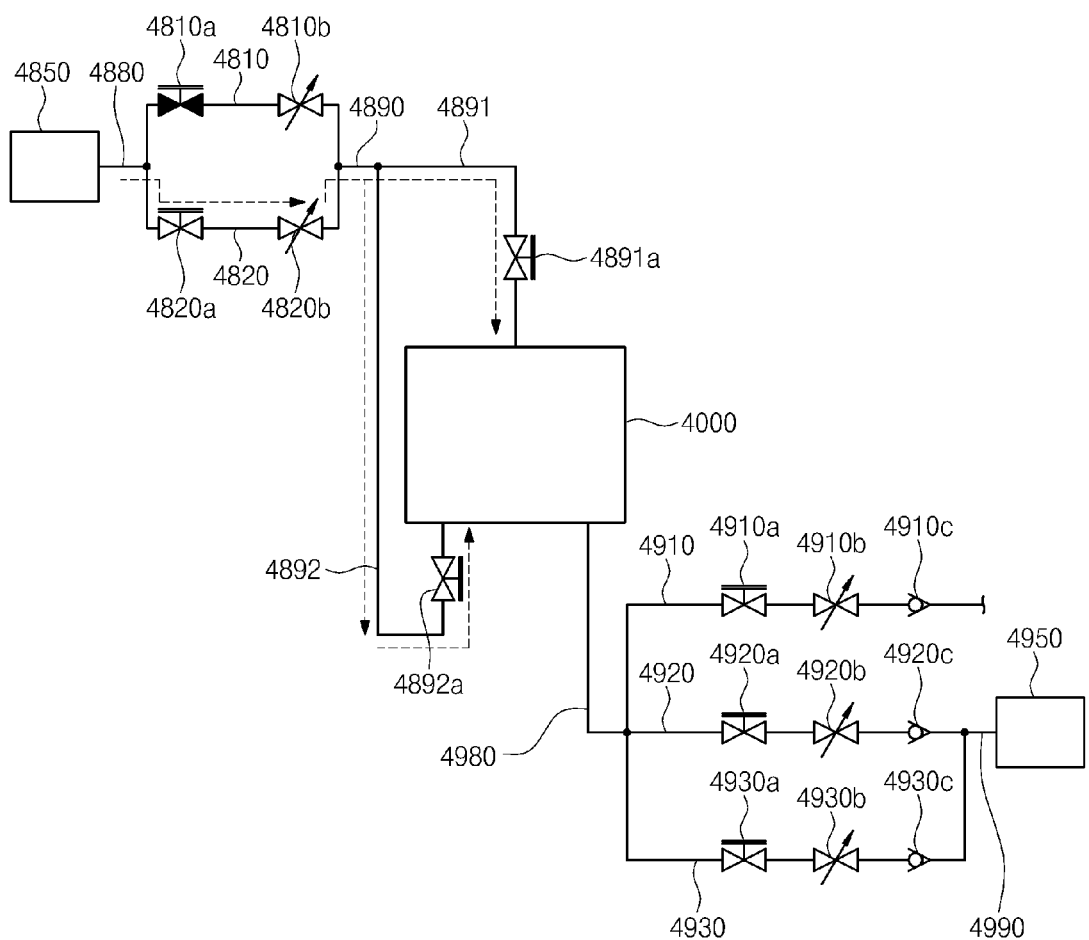

When the internal pressure of the second process chamber 4000 reaches a predetermined pressure, the supercritical fluid can be simultaneously supplied through both upper and lower parts to increase the process speed and efficiency. Referring to FIG. 12, as a modified example of the substrate drying embodiment, when the internal pressure of the second process chamber 4000 reaches a predetermined pressure due to the supply of the supercritical fluid, the supercritical fluid may be supplied into the second process chamber 4000 through both first rear supply line 4891 and second rear supply line 4892. In this case, the first shut-off valve 4810a of the first supply line 4810 may be closed, and the shut-off valve 4891a of the first rear supply line 4891, the shut-off valve 4892a of the second rear supply line 4892, and second shut-off valve 4820a of the second supply line 4820 may be opened. In this case, the process time can be shortened and the process efficiency can be improved by increasing the supply speed of the supercritical fluid into the second process chamber 4000.

Although not shown, the flow rate of the supercritical fluid flowing in the second supply line 4820 can be adjusted by controlling the second flow control valve 4820b of the second supply line 4820 during the process. In this case, the internal pressure of the second process can be adjusted by controlling the flow rate of the supercritical fluid during the process without an additional supply line. Thus, particles may be prevented from occurring in the second process chamber 4000, and the substrate S may be prevented from being damaged.

Also, although not shown, the supercritical fluid may be supplied at a third flow rate larger than a predetermined flow rate of supercritical fluid of the first supply line 4810 and the second supply line 4820. In this case, when the internal pressure reaches a predetermined pressure by supplying the supercritical fluid through the first supply line 4810, the supercritical fluid may be supply at the third supply flow rate to shorten the process time and improve the process efficiency.

Figure 13:
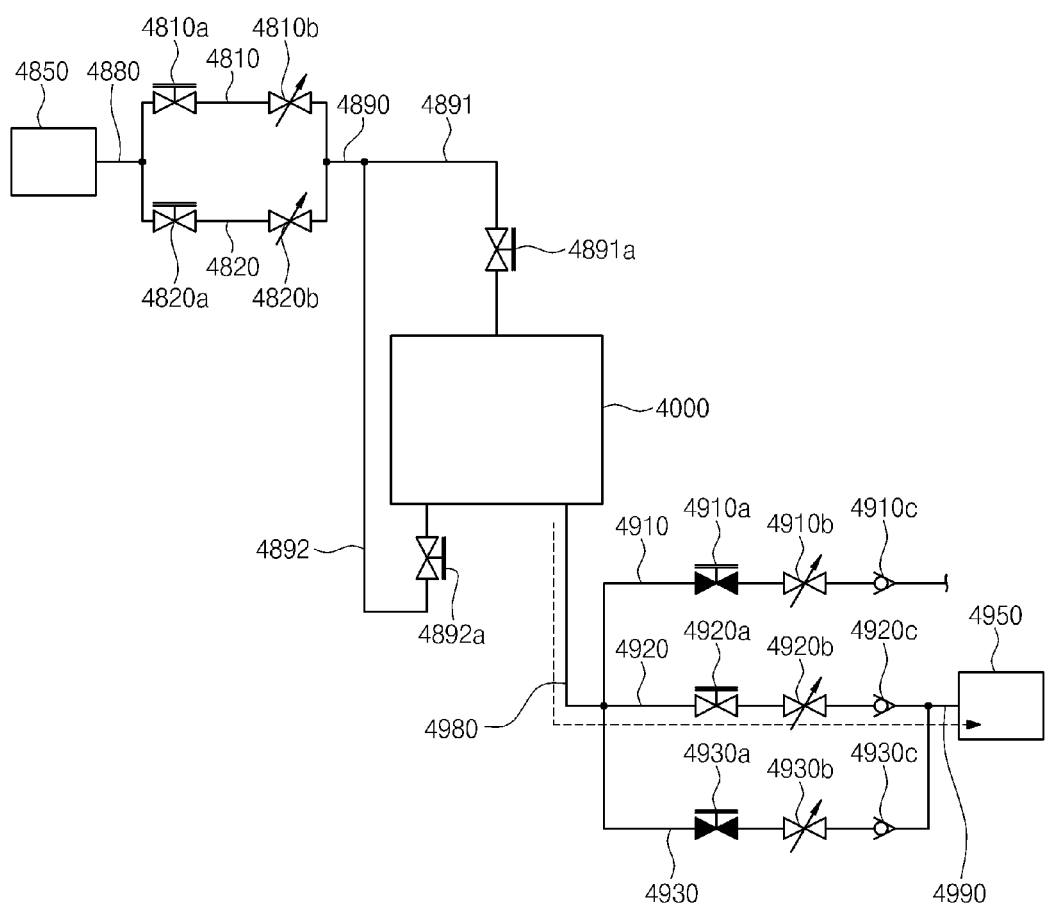

At an initial stage of the discharge process of the supercritical fluid, a small amount of supercritical fluid may be discharged. Referring to FIG. 13, at an initial stage of the discharge process, the first shut-off valve 4910a of the first discharge line 4910 and the third shut-off valve 4930a of the third discharge line 4930 may be closed, and the second shut-off valve 4920a of the second discharge line 4920 may be opened. Accordingly, the supercritical fluid may be discharged from the second process chamber 4000 through the front discharge line 4980 and the second discharge line 4920.

The second flow control valve 4920b of the second discharge line 4920 may adjust the flow rate of the supercritical fluid into the second discharge flow rate, such that the substrate S is not damaged or particles do not occur in the second process chamber 4000 due to a rapid pressure variation at an initial discharge stage. The second discharge flow rate may be configured such that the internal pressure of the second process chamber 4000 does not rapidly change at an initial discharge stage. Thus, particles can be prevented from occurring in the second process chamber 4000, and the substrate S can be prevented from being damaged.

Figure 14:
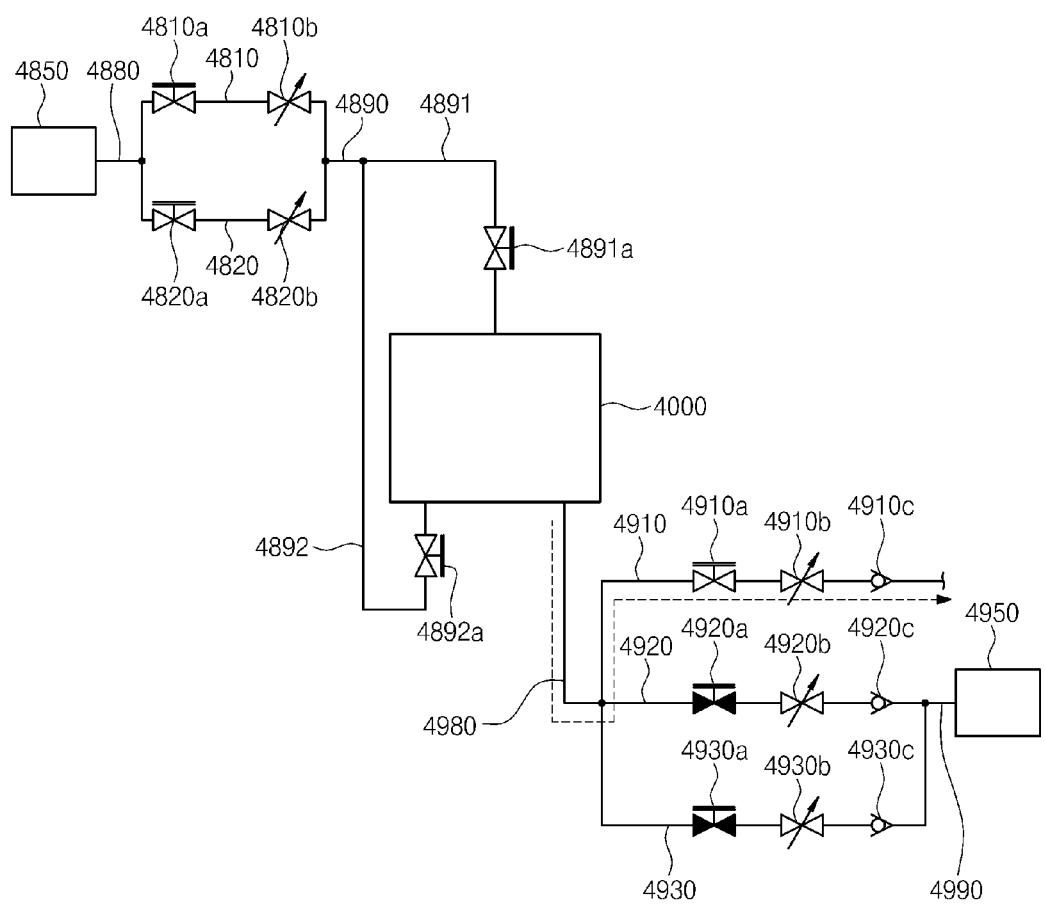

When the internal pressure of the second process chamber 4000 reaches a predetermined pressure through the second discharge line 4920, the supercritical fluid may be discharged through the first discharge line 4910. Referring to FIG. 14, when the internal pressure of the second process chamber 4000 reaches a predetermined pressure by discharging the supercritical fluid, the second shut-off valve 4920a of the second discharge line 4920 and the third shut-off valve 4930a of the third discharge line 4930 may be closed, and the first shut-off valve 4910a of the first discharge line 4910 may be opened. The supercritical fluid may be discharged from the second process chamber 4000 through the front discharge line 4980 and the first discharge line 4910. In this case, the first discharge flow rate of the supercritical fluid discharged through the first discharge line 4910 may be adjusted greater than the second discharge flow rate of the second discharge line 4920. When the internal pressure of the second process chamber 4000 reaches a predetermined pressure, since the substrate S is not damaged or particles do not occur in the second process chamber 4000 regardless of a rapid pressure variation, a large amount of supercritical fluid can be discharged. Thus, the drying process time can be shortened, and the efficiency of the drying process can be improved.

Although not shown, the flow rate of the supercritical fluid flowing through the second discharge line 4920 may be adjusted by controlling the second flow control valve 4920b of the second discharge line 4920 during the process. In this case, the internal pressure of the second process chamber 4000 can be adjusted by controlling the flow rate of the supercritical fluid during the process without an additional discharge line. Thus, particles may be prevented from occurring in the second process chamber 4000, and the substrate S may be prevented from being damaged.

Also, although not shown, the supercritical fluid may be discharged at a third discharge flow rate larger than a predetermined flow rate of the supercritical fluid of the first discharge line 4910 and the second discharge line 4920. In this case, when reaching a predetermined pressure by discharging the supercritical fluid at the first discharge flow rate, the process time can be shortened and the process efficiency can be improved by discharging the supercritical fluid at the third discharge flow rate.

According to an embodiment of the inventive concept, when a supercritical fluid is supplied into a process chamber, particles can be prevented from occurring, and a substrate can be prevented from being damaged.

According to an embodiment of the inventive concept, the process time can be shortened, and thus the process efficiency can be improved by quickly supplying and discharging a supercritical fluid.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. An apparatus for drying a substrate, comprising:
    a housing providing a space in which a drying process is performed;
    a substrate support member provided in the housing to support the substrate;
    a storage storing a process fluid of a supercritical state;
    a fluid supply member comprising a supply line for supplying the process fluid of the supercritical state from the storage to the housing; and
    a discharge member comprising a discharge line for discharging the process fluid from the housing,
    wherein the supply line comprises:
        a lower supply line connected to a bottom of the housing and provided to supply the process fluid from the storage to the housing at a first supply flow rate before an internal pressure of the housing reaches a predetermined pressure; and
        an upper supply line connected to a top of the housing and provided to supply the process fluid from the storage to the housing at a second supply flow rate after the internal pressure of the housing reaches the predetermined pressure.

2. The apparatus of claim 1, wherein the supply line further comprises:
    a front supply line connected to the storage ; and
    a rear supply line connected to the housing,
    wherein the lower supply line and the upper supply line are connected in parallel to each other, and connect between the front supply line and the rear supply line.

3. The apparatus of claim 1, wherein:
    the lower supply line comprises a first flow control valve that controls the process fluid to flow at the first supply flow rate;
    the upper supply line comprises a second flow control valve that controls the process fluid to flow at the second supply flow rate; and
    the first flow control valve and the second flow control valve are controlled such that the second supply flow rate is greater than the first supply flow rate.

4. The apparatus of claim 3, wherein the supply line further comprises a third supply line provided with a third flow control valve that controls the process fluid to flow at a third supply flow rate, and the third flow control valve is controlled such that the third supply flow rate is greater than the second supply flow rate.

5. The apparatus of claim 3, wherein the supply line further comprises a controller, which controls an opening degree of the second flow control valve during the drying process such that the first supply flow rate and the second supply flow rate of the process fluid passing through the supply line are controlled.

* * * * *